United States Patent [19]

Wang

[11] Patent Number: 6,064,262

[45] Date of Patent: May 16, 2000

[54] CMOS DIFFERENTIAL AMPLIFIER HAVING OFFSET VOLTAGE CANCELLATION AND COMMON-MODE VOLTAGE CONTROL

[75] Inventor: Hongmo Wang, Watchung, N.J.

[73] Assignee: Lucent Technologies Inc., Murray Hill, N.J.

[21] Appl. No.: 09/160,932

[22] Filed: Sep. 25, 1998

[51] Int. Cl.[7] ................................................ H03F 3/45
[52] U.S. Cl. ................................................ 330/253; 330/258
[58] Field of Search ................................ 330/253, 258, 330/259, 261

[56] References Cited

U.S. PATENT DOCUMENTS

| | | | |
|---|---|---|---|
| 5,436,594 | 7/1995 | Pace et al. | 330/258 |
| 5,463,347 | 10/1995 | Jones et al. | 330/253 |
| 5,789,980 | 8/1998 | Nagata et al. | 330/253 |
| 5,939,904 | 8/1999 | Fetterman et al. | 330/258 X |

Primary Examiner—Steven J. Mottola

[57] ABSTRACT

A differential amplifier for amplifying the difference between first and second input signals and producing therefrom a differential output signal. The differential amplifier includes first and second transistors connected to a common DC current source and receiving, at the transistor gate terminals, the respective first and second input signals. Each transistor has a common mode voltage associated therewith. A voltage control circuit generates control signals that are applied to the backgate terminals of the transistors to calibrate the differential output voltage and to adjust the common mode voltages of the transistors.

3 Claims, 2 Drawing Sheets

CM OS DIFFERENTIAL AMPLIFIER HAVING OFFSET VOLTAGE CANCELLATION AND COMMON-MODE VOLTAGE CONTROL

BACKGROUND OF THE INVENTION

1. Field of the Invention

The present invention relates to operational amplifiers and, more particularly, to CMOS differential amplifiers having DC offset and common-mode voltage control.

2. Background of Related Art

Balanced pairs of transistors, such as CMOS transistors, are often configured as differential pairs and used as common building blocks in amplifier design. In particular, such transistor pairs are typically employed in differential amplifiers to amplify the difference between two input signals. The problems associated with use of CMOS transistors as a differential pair lie in the offset voltage and in the common-mode voltage of each transistor.

A known differential amplifier circuit 10 is schematically depicted in FIG. 1. The circuit 10 is constructed as a first a pair of transistors $Q_1$ and $Q_2$ connected to a DC current source I and connected to a second pair of transistors $Q_3$, $Q_4$ that may function as a load and/or as a transconductance element, as is known in the art, and which are connected to a voltage source $V_{dd}$. Each transistor has a gate, a drain and a source terminal. As shown, $Q_1$ and $Q_2$ are operated as a differential pair; a separate input signal is applied to each transistor $Q_1$ and $Q_2$ such that a first input signal $V_1$ is applied to the gate terminal of transistor $Q_1$ and a second input signal $V_2$ is applied to the gate terminal of transistor $Q_2$. The output of the circuit 10 is an amplified signal of the difference between $V_1$ and $V_2$. Under ideal conditions, $Q_1$ and $Q_2$ are equivalent in size so that their threshold or turn-on voltages are identical. This results in a zero output voltage when the difference between the input signals $V_1$ and $V_2$ is zero (e.g., the two signals are identical). In other words, when $V_1-V_2=0$, $V_0$ should ideally also be zero. However, due to various factors such as manufacturing variables, perfectly matched pairs of transistors are difficult to obtain, thus resulting in a non-zero value of $V_0$ when the differential input signal is zero. Such a condition detrimentally reduces the dynamic operating range of the circuit 10. In order to obtain as close to a balanced pair of transistors as possible, current techniques physically alter the sizes of the transistors so that the transistors in a balanced pair configuration are matched. This technique typically employs lasers which shave down or trim the dimensions of the transistors and, as can be appreciated, such a procedure is tedious, time consuming and costly.

Another parameter used in designing differential pairs of transistors for use in operational amplifiers is the common mode voltage (CMV) which is the DC value of the output voltage from each transistor in the pair, i.e. the voltage at the drain (D) terminal of $Q_1$. In practice, it is desirable to design a differential pair with the CMV selected to be a particular value based on predefined criteria or the intended function of the operational amplifier. For example, in some instances it is desired to have a rail-to-rail swing for the signal, e.g. to have the CMV value sit at the halfway point between ground and $V_{dd}$.

Known techniques for obtaining a desired CMV value for the differential pair $Q_1$ and $Q_2$ involve controlling the voltages applied to the loading transistors $Q_3$ and $Q_4$. This is usually accomplished by employing a common mode feedback circuit 20 connected between the source and gate terminals of at least one of the loading transistors (e.g. $Q_3$). The drawback of such a technique, however, is that it compromises the versatility of the amplifier circuit because the gate terminal of one or more of the loading transistors must be utilized for the feedback circuit. This, of course, prevents the use of such a terminal for the input of an additional signal, e.g. the input of a signal to the gate terminal of $Q_3$.

SUMMARY OF THE INVENTION

The present invention provides a novel circuit design for a differential amplifier using a pair of transistors to control the differential output voltage and the common mode voltage. The inventive circuit employs a pair of transistors, such as CMOS transistors, each having a gate, a source, a drain and a backgate terminal and connected to a common current source. An input signal is received by the gate terminals of each of the transistors in the pair and a differential output voltage is obtained from one of the source or drain terminals of the pair. The differential output voltage and common mode voltage are controlled by a control circuit for applying appropriate control signals to the backgate terminals of the pair for altering the threshold voltages of each transistor. This allows the common mode voltage and differential output voltage to be dynamically adjusted without having to usurp or occupy the input terminals of the loading transistors and without the need for selective physical alteration of the dimensions of the transistors in the balanced pair.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference numerals denote similar elements throughout the several views.

DETAILED DESCRIPTION OF THE CURRENTLY PREFERRED EMBODIMENT

Figure 1:
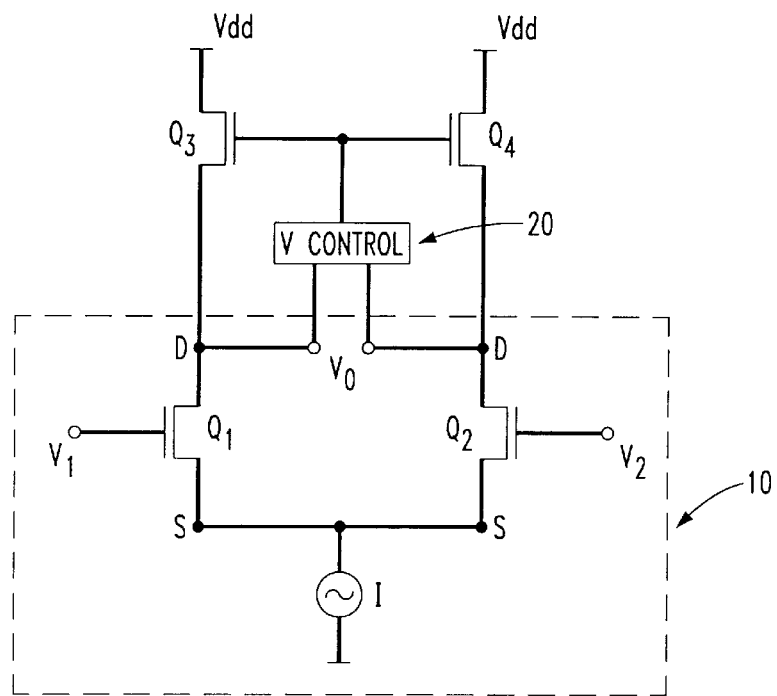
FIG. 1 is a schematic representation of a prior art differential amplifier.
Figure 2:
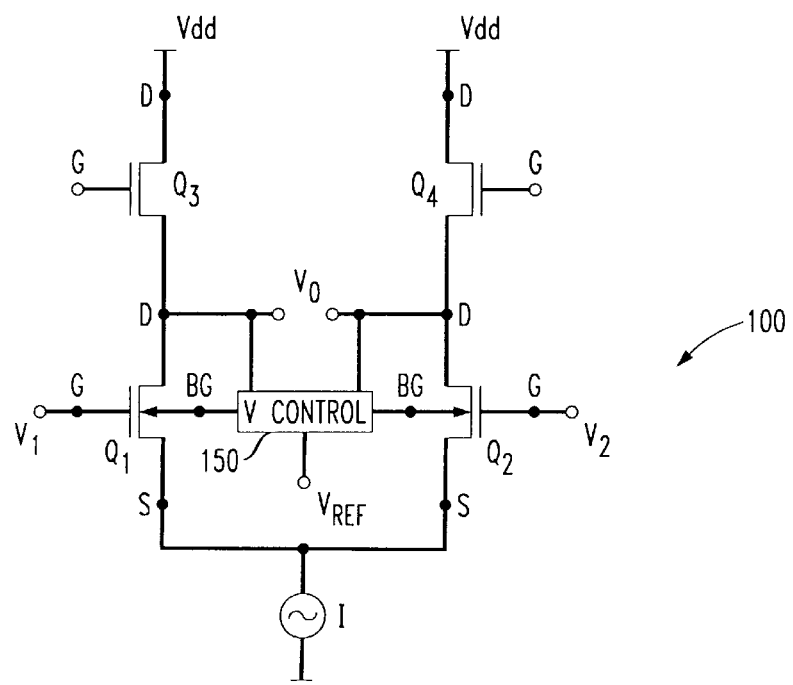
FIG. 2 is a schematic representation of a differential amplifier having common mode voltage and differential output voltage control in accordance with a preferred embodiment of the present invention.

A differential amplifier circuit 100 constructed in accordance with the present invention is depicted in FIG. 2. Circuit 100 includes a pair of transistors $Q_1$ and $Q_2$, each having a base, a source, a drain and a backgate terminal and connected at the drain terminal to a DC current source (I) which provides a biasing quiescent current to the circuit. In the preferred embodiment, transistors $Q_1$ and $Q_2$ are CMOS transistors which, as is known in the art, are symmetrical devices. Thus, although current source I is shown connected to the source terminals, it could likewise be connected to the drain terminals. Biasing of the transistor pair $Q_1$ and $Q_2$ is completed through a pair of biasing transistors $Q_3$, $Q_4$, respectively, that are connected to a DC voltage source $V_{dd}$. The transistors $Q_3$, $Q_4$ can be used as a load device or as an active transconductance device.

The transistors $Q_1$ and $Q_2$ of the amplifier circuit are operated as a differential amplifier circuit to amplify a difference between two input signals. As is known in the art, and depending on the input conditions, i.e., the values of the input signals, one transistor in the pair (e.g., $Q_1$) will generate a large transconductance while the other transistor in the pair (e.g., $Q_2$) will generate a lower transconductance, thereby resulting in a differential amplification. It is also widely known that the threshold voltage of a CMOS transistor can be adjusted (e.g. raised or lowered) by applying an appropriate voltage to the backgate terminal. Using this principle, the incorporation of a voltage control circuit 150 to the circuit 100 for applying an appropriate voltage to one or more of the backgate terminals of transistors $Q_1$ and $Q_2$ will allow adjustment of the threshold or turn-on voltages of $Q_1$ and $Q_2$ and provide control for both the common mode voltage of each of the transistors in the differential pair. This will also provide control or calibration of the dc offset level of the differential output voltage ($V_O$).

For example, and as explained above, under ideal conditions it is preferred that the differential output $V_O$ be zero when the differential input is zero, i.e. when $V_1-V_2=0$. By applying appropriate voltages to the backgate terminals of the real-world transistors $Q_1$ and $Q_2$, the differential output voltage $V_O$ can be adjusted to be zero when desired so as to eliminate the unintended characteristic variations or difference between the transistors $Q_1$ and $Q_2$. In addition, as $V_O$ is the difference between two voltage values of the differential pair, the common mode voltage can, likewise, be adjusted up or down while still maintaining a desired differential output voltage. Thus, by using a voltage control circuit 150 to apply appropriate voltages to the backgate terminals of the transistors in the balanced pair, the common mode voltage and the differential voltage can be controlled without physically altering the dimensions of the transistors in the balanced pair (e.g. by utilizing lasers, as in the prior art) or by occupying and thereby utilizing one or more of the gate terminals of the biasing transistors $Q_3$ and $Q_4$. Thus, the gate terminals of the loading transistors are available for receiving additional signals, as for example to provide additional gain to the amplifier circuit.

Various configurations of the voltage controller 150 will be readily known to those having ordinary skill in the art. One such example is schematically depicted by way of illustration within the dashed lines of FIG. 3. The voltage controller 150 is typically a feedback circuit that measures the differential output voltage and common mode voltage for particular input signal values, and then adjusts the signals applied to the backgate terminals to yield the desired differential output and common mode voltage values.

Figure 3:
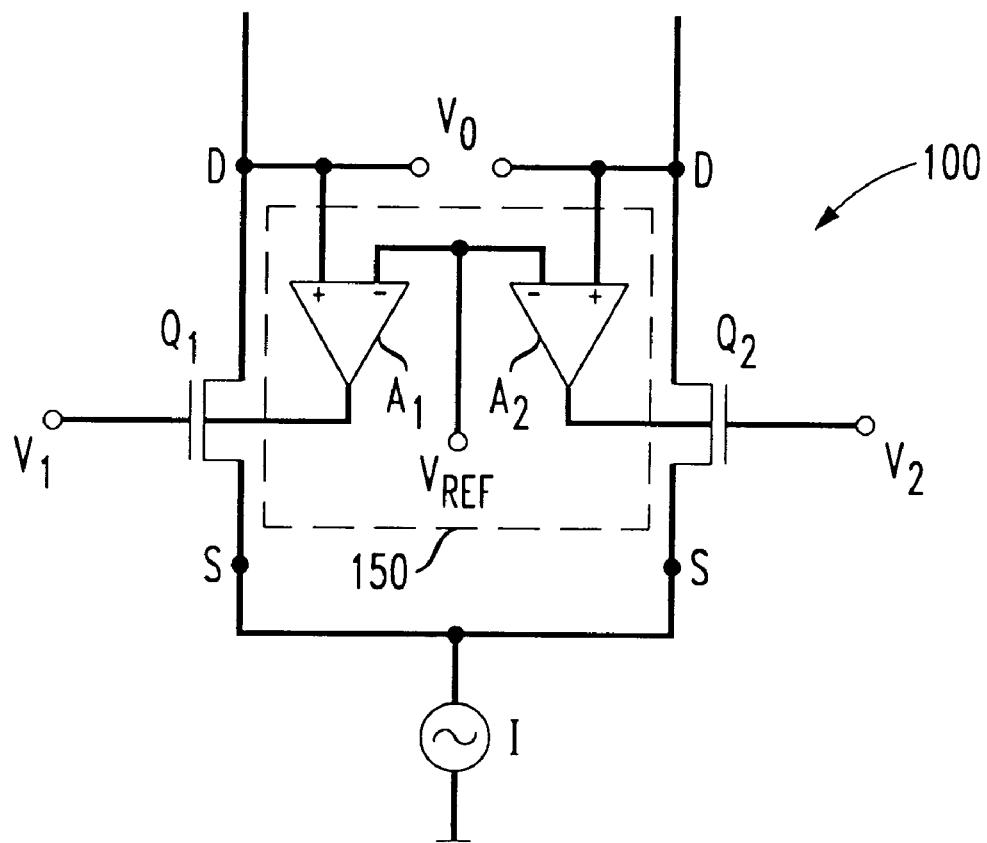
FIG. 3 is a schematic representation of a typical voltage regulator circuit for use with the inventive amplifier of FIG. 2.

As shown in FIG. 3, the exemplary controller 150 is implemented by a pair of low-precision operational amplifiers ("op-amps") $A_1$ and $A_2$ which are configured for DC operation. Each op-amp is assigned to one of the transistors so that op-amp $A_1$ is connected to transistor $Q_1$ and op-amp $A_2$ is connected to transistor $Q_2$. Op-amp $A_1$ has a positive input terminal tied to the drain terminal of $Q_1$, an output terminal connected to the backgate terminal of $Q_2$ and a positive terminal tied to a reference voltage $V_{ref}$, which is also connected to the negative terminal of $A_2$. $V_{ref}$ sets the common mode voltage values (i.e. the drain terminal voltage values) for transistors $Q_1$ and $Q_2$ and forces the difference between the two common mode values to be zero.

While there have been shown and described and pointed out fundamental novel features of the present invention as applied to a preferred embodiment thereof, it will be understood that various omissions and substitutions and changes in the methods described and in the form and details of the devices illustrated, and in their operation, may be made by those skilled in the art without departing from the spirit of the present invention. For example, it is expressly intended that all combinations of those elements which perform substantially the same function in substantially the same way to achieve the same results are within the scope of the invention. It is also to be understood that the drawings are not necessarily drawn to scale but that they are merely conceptual in nature. It is the intention, therefore, to be limited only as indicated by the scope of the claims appended hereto.

I claim:

1. A differential amplifier for amplifying a first input signal and a second input signal and for generating a differential output signal, comprising:

a first transistor having a gate terminal, a source terminal, a drain terminal and a backgate terminal for receiving at its gate terminal the first input signal and for outputting from one of its source and drain terminals an amplified version of the first input signal as a first portion of the differential output signal, said first transistor having an associated first common mode voltage;

a second transistor having a gate terminal, a source terminal, a drain terminal and a backgate terminal for receiving, at its gate terminal, the second input signal and for outputting from one of its source and drain terminals an amplified version of the second input signal as a second portion of the differential output signal;

a DC current source connected to the other of said drain and source terminals of said first and second transistors for supplying a biasing quiescent current to said amplifier; and means for adjusting the common mode voltage of said first transistor and the differential output signal by applying a signal to said backgate terminal of said first transistor for varying the common mode voltage of the first transistor and for calibrating the differential output signal to yield a desired value for a particular value of one of the first and the second input signals.

2. The amplifier of claim 1, wherein said second transistor has a second common mode voltage, and wherein said adjusting means comprises means for adjusting the second common mode voltage by applying a signal to the second transistor backgate terminal.

3. The amplifier of claim 1, wherein said first and second transistors comprise CMOS transistors.

\* \* \* \* \*